(12) United States Patent
Sumiyoshi (10) Patent No.: US 8,760,618 B2
(45) Date of Patent: Jun. 24, 2014

(54) PROJECTION OPTICAL SYSTEM, EXPOSURE APPARATUS AND DEVICE MANUFACTURING METHOD

(75) Inventor: Yuhei Sumiyoshi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 536 days.

(21) Appl. No.: 12/687,997

(22) Filed: Jan. 15, 2010

(65) Prior Publication Data

US 2010/0182577 A1    Jul. 22, 2010

(30) Foreign Application Priority Data

Jan. 19, 2009    (JP) ................................ 2009-009334

(51) Int. Cl.
*G03B 27/68* (2006.01)

(52) U.S. Cl.
USPC .......................................................... 355/52

(58) Field of Classification Search
USPC .......................... 355/52, 53, 77, 55; 359/708
See application file for complete search history.

(56) References Cited

U.S. PATENT DOCUMENTS

| | | | | |
|---|---|---|---|---|
| 5,726,739 A | * | 3/1998 | Hayata | 355/67 |
| 5,789,734 A | * | 8/1998 | Torigoe et al. | 250/201.2 |
| 6,104,472 A | | 8/2000 | Suzuki | |
| 6,172,740 B1 | * | 1/2001 | Suzuki | 355/53 |
| 6,307,618 B1 | * | 10/2001 | Suzuki et al. | 355/53 |
| 7,106,455 B2 | | 9/2006 | Suzuki et al. | |
| 2002/0080338 A1 | * | 6/2002 | Taniguchi | 355/67 |
| 2008/0018870 A1 | * | 1/2008 | Omura | 355/52 |
| 2010/0225889 A1 | * | 9/2010 | Sumiyoshi | 355/55 |

FOREIGN PATENT DOCUMENTS

| | | |
|---|---|---|
| JP | 10-242048 A | 9/1998 |
| JP | 2001-358072 A | 12/2001 |

\* cited by examiner

*Primary Examiner* — Peter B Kim
*Assistant Examiner* — Deoram Persaud
(74) *Attorney, Agent, or Firm* — Rossi, Kimms & McDowell LLP (57) ABSTRACT

A projection optical system of the present invention includes an optical element group that includes optical elements, and a controller that drives at least one of the first optical elements. The optical element group includes aspheric surfaces having a complementary relationship with each other and are arranged so that the aspheric surfaces face each other. The controller changes a relative position between the optical elements in a first direction and a second direction orthogonal to the first direction to control optical performances of the projection optical system corresponding to each of the first direction and the second direction.

26 Claims, 8 Drawing Sheets

| SURFACE NUMBER | EFFECTIVE DIAMETER | RADIUS OF CURVATURE | SURFACE SEPARATION | KIND OF GLASS |
|---|---|---|---|---|
| 0 | 168.0 | 0.00000 | 16.394 | |
| 1 | 173.2 | 0.00000 | 1.000 | |
| 2 | 173.6 | 0.00000 | 14.483 | SiO2 |
| 3 XY | 176.6 | 0.00000 | 0.020 | |
| 4 XY | 176.6 | 0.00000 | 14.483 | SiO2 |
| 5 | 179.7 | 0.00000 | 55.000 | |
| 6 | 194.3 | -431.85290 | 18.828 | SiO2 |
| 7 | 206.0 | 5528.38518 | 7.067 | |
| 8 ASP | 210.3 | 7625.94630 | 31.761 | SiO2 |
| 9 | 216.3 | -391.68285 | 0.724 | |
| 10 | 223.8 | 668.10057 | 34.961 | SiO2 |
| 11 | 224.8 | -531.87355 | 0.724 | |
| 12 | 221.7 | 375.70524 | 32.141 | SiO2 |
| 13 | 218.0 | -3547.56388 | 2.577 | |
| 14 | 205.6 | 239.84582 | 32.371 | SiO2 |
| 15 | 182.2 | 156.20978 | 25.355 | |
| 16 | 181.3 | 528.75034 | 22.132 | SiO2 |
| 17 | 173.3 | 240.04602 | 26.457 | |
| 18 | 173.2 | -594.41619 | 18.828 | SiO2 |
| 19 | 177.0 | 314.66628 | 33.602 | |
| 20 | 181.3 | -350.17423 | 18.828 | SiO2 |
| 21 ASP | 200.6 | 669.95521 | 43.181 | |
| 22 | 205.4 | -184.88478 | 18.828 | SiO2 |
| 23 | 253.0 | -1075.75487 | 17.066 | |
| 24 | 267.4 | -547.40844 | 37.212 | SiO2 |
| 25 | 284.3 | -269.84170 | 0.724 | |
| 26 | 328.8 | -2158.14024 | 50.044 | SiO2 |
| 27 | 341.1 | -370.00576 | 0.724 | |
| 28 | 371.5 | 18265.21491 | 60.546 | SiO2 |
| 29 | 379.0 | -415.43037 | 0.724 | |
| 30 | 393.8 | 920.64210 | 55.857 | SiO2 |
| 31 | 393.7 | -1016.48278 | 0.724 | |
| 32 | 380.6 | 457.25830 | 61.082 | SiO2 |
| 33 | 373.8 | -4231.36179 | 0.724 | |
| 34 | 337.4 | 343.15039 | 61.418 | SiO2 |
| 35 ASP | 322.1 | 25246.70358 | 21.637 | |
| 36 | 298.2 | -2221.58082 | 18.828 | SiO2 |
| 37 | 252.4 | 250.95767 | 42.049 | |
| 38 | 249.4 | -2461.52257 | 18.828 | SiO2 |
| 39 ASP | 230.2 | 218.85428 | 67.199 | |
| 40 | 230.4 | -233.51464 | 18.828 | SiO2 |
| 41 | 248.3 | -1674.68615 | 34.830 | |
| 42 | 249.8 | -230.50421 | 27.340 | SiO2 |
| 43 | 299.4 | -43890.96626 | 22.480 | |
| 44 ASP | 312.3 | -988.84238 | 50.425 | SiO2 |
| 45 | 326.3 | -300.24254 | 3.744 | |
| 46 | 366.0 | 0.00000 | -2.296 | |
| 47 | 367.7 | 3775.26991 | 54.713 | SiO2 |
| 48 | 373.0 | -472.44876 | 0.724 | |
| 49 | 396.6 | 623.48294 | 78.010 | SiO2 |
| 50 | 397.6 | -600.99945 | 25.059 | |
| 51 | 397.2 | -372.75446 | 27.517 | SiO2 |
| 52 | 409.0 | -537.07248 | 39.045 | |
| 53 | 408.2 | 2277.04491 | 36.307 | SiO2 |
| 54 | 407.4 | -1381.77468 | 0.724 | |
| 55 | 388.2 | 345.22067 | 61.149 | SiO2 |
| 56 | 380.4 | 1576.85894 | 0.724 | |
| 57 | 331.9 | 228.44314 | 56.656 | SiO2 |
| 58 | 316.7 | 464.50601 | 0.724 | |
| 59 | 273.5 | 192.71433 | 48.401 | SiO2 |
| 60 | 252.7 | 384.41787 | 11.815 | |
| 61 ASP | 248.2 | 672.73019 | 18.828 | SiO2 |
| 62 | 178.5 | 116.04820 | 26.430 | |
| 63 | 161.4 | 117.34879 | 88.902 | SiO2 |
| 64 | 87.5 | 655.91681 | 21.724 | |

FIG. 10

| SURFACE NUMBER | k | A | B | C | D |
|---|---|---|---|---|---|
| 8 | 1.00000 | 1.08908E-09 | -2.00292E-14 | 6.10679E-19 | -3.61996E-23 |
| 21 | -0.96847 | -2.07652E-09 | -4.43811E-14 | -2.15256E-19 | -2.89488E-24 |
| 35 | 0.26677 | -5.02702E-11 | 1.15629E-14 | -4.26790E-19 | 2.65294E-24 |
| 39 | 0.19637 | -2.57328E-09 | -2.29817E-13 | -4.90735E-18 | -1.86036E-23 |
| 44 | 1.00000 | -4.88462E-10 | -4.14605E-15 | -1.37076E-19 | 4.66101E-24 |
| 61 | -0.44978 | -2.11121E-10 | -9.12581E-15 | 2.16687E-19 | 3.73835E-25 |

FIG. 11

PROJECTION OPTICAL SYSTEM, EXPOSURE APPARATUS AND DEVICE MANUFACTURING METHOD

BACKGROUND OF THE INVENTION

Field of the Invention

The present invention relates to a projection optical system and an exposure apparatus.

In an exposure apparatus, higher overlay accuracy is desired, and therefore it is important to suppress a wavefront aberration, a magnification error, or a distortion of a projection optical system to improve the stability of an optical performance. Recently, in order to control the optical performance of the projection optical system with higher accuracy as compared with a conventional one, not only corrections of the magnification error and a symmetric third-order distortion but also corrections of a higher-order distortion and further a rotationally asymmetric magnification and a rotationally asymmetric distortion have been needed.

Japanese Patent Laid-Open Nos. 2001-358072 and H10-242048 disclose an exposure apparatus capable of adjusting an optical characteristic that is rotationally asymmetric with respect to the optical axis of the projection optical system, which remains in a projection optical system.

Japanese Patent Laid-Open No. 2001-358072 discloses a first optical means for correcting a rotationally asymmetric astigmatism component that remains in the optical system and a second optical means for correcting a rotationally asymmetric magnification error component that remains in the projection optical system. The first optical means corrects the rotationally asymmetric astigmatism component without much influencing the rotationally asymmetric magnification error component, and the second optical means corrects the rotational asymmetric magnification error component without much influencing the rotational asymmetric astigmatism element.

Japanese Patent Laid-Open No. H10-242048 discloses a configuration where a pair of optical elements that has aspheric surfaces having a complementary relationship with each other is arranged so that the aspheric surfaces face each other to control an aberration of the projection system by changing a relative position of a plurality of optical elements.

In the above exposure apparatus, when plural types of rotationally asymmetric aberrations are corrected, nearly twice as many optical members as the types of aberrations to be corrected are required. Further, mechanical drive mechanisms as many as the optical members for changing positions of the optical members to which the aberrations are corrected are required. However, in some cases, it is difficult to arrange the plurality of optical members in a limited space of the projection optical system.

SUMMARY OF THE INVENTION

The present invention provides a projection optical system that corrects a plurality of higher-order distortions and rotationally asymmetric distortions with a small number of optical members, and an exposure apparatus comprising the projection optical system.

A projection optical system as one aspect of the present invention is a projection optical system for projecting a pattern on a mask onto a substrate, the projection optical system comprising a pair of optical elements that includes a first optical element having a first aspheric surface and a second optical element having a second aspheric surface, and a controller configured to drive at least one of the first optical element and the second optical element. The first aspheric surface and the second aspheric surface have a complementary relationship with each other and are arranged so as to face each other, and the controller changes a relative position between the first aspheric surface and the second aspheric surface in a first direction and a second direction orthogonal to the first direction to control optical performances of the projection optical system corresponding to each of the first direction and the second direction.

An exposure apparatus as another aspect of the present invention includes the above projection optical system.

A device manufacturing method as another aspect of the present invention includes a step of exposing a pattern on the mask using the above exposure apparatus and a step of developing the substrate exposed by the exposing step.

DESCRIPTION OF THE EMBODIMENTS

Exemplary embodiments of the present invention will be described below with reference to the accompanied drawings. In each of the drawings, the same elements will be denoted by the same reference numerals and the duplicate descriptions thereof will be omitted.

Embodiment 1

Figure 1:
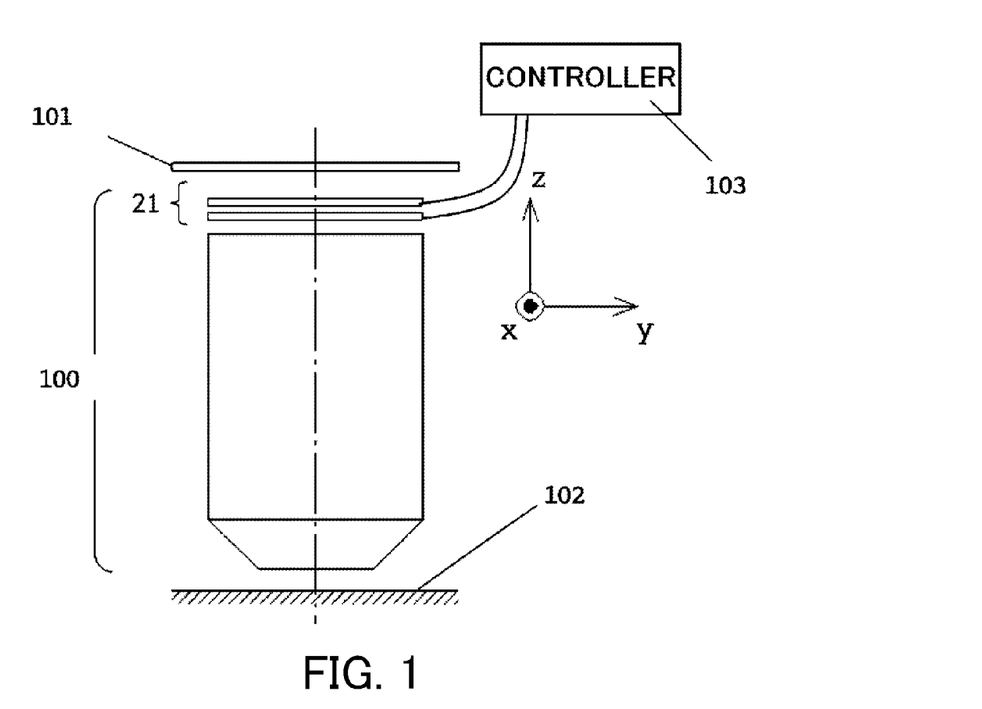
FIG. 1 is a schematic configuration diagram of an exposure apparatus in embodiments of the present invention.

First, the configuration of a projection optical system in embodiment 1 of the present invention will be described. FIG. 1 is a schematic diagram of the projection optical system in this embodiment.

In this embodiment, a projection optical system 100 means a projection optical system such as a refraction system or a catadioptric system, and a pattern on a reticle (mask) 101 illuminated by an illumination system not shown in the drawing is projected onto a wafer 102 (substrate).

Figure 2:
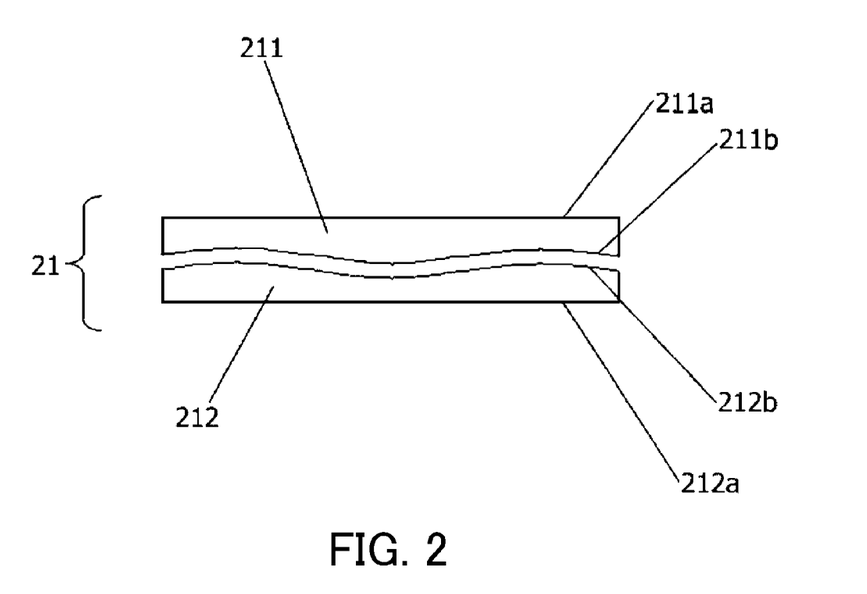
FIG. 2 is a cross-sectional diagram of an optical element group in embodiments.

As shown in FIG. 1, the projection optical system 100 comprises an optical element group 21 (a pair of optical elements) facing the reticle 101. As shown in FIG. 2, the optical element group 21 includes optical elements 211 and 212 (a first optical element and a second optical element) that have aspheric surfaces. The optical element group 21 may be configured as a part of the projection optical system 100 or as a unit separable from the projection optical system 100. The optical element group 21 may also be integrated with a reticle holder or a reticle stage mechanism (not shown) that hold the reticle 101. A controller 103 is configured to drive the optical element group 21 and is capable of driving the optical elements 211 and 212 independently.

Next, the configuration of the optical element group 21 in FIG. 1 will be specifically described. In FIG. 2, outer surfaces 211a and 212a of the two optical elements 211 and 212 have planar shapes, and surfaces 211b and 212b (a first aspheric surface and a second aspheric surface) facing each other have aspheric shapes having a complementary relationship with each other.

In the embodiment, as shown in FIG. 1, a z-axis is defined as a direction which is parallel to an optical axis of the projection optical system from a wafer 102 toward the reticle 101, and an x-axis and a y-axis are defined as directions orthogonal to the z-axis. The y-axis is in a plane of paper, and the x-axis is orthogonal to the plane of paper toward its front side. As a result, the aspheric shapes of the optical elements 211 and 212 are represented by the following EQUATION 1 which is different only in a constant term.

[EQUATION 1]

$$f_a(x,y) = g(x) + h(y) + C_a \quad (1a)$$

$$f_b(x,y) = g(x) + h(y) + C_b \quad (1b)$$

In the above expressions, fa(x, y) denotes the aspheric shape of the optical element 211 and fb(x, y) denotes the aspheric shape of the optical element 212. g(x) denotes a function whose the variable is only x, and h(y) denotes a function whose the variable is only y. Ca and Cb denote the constant terms.

In the initial state, the convexoconcave of the aspheric shape fa(x,y) in the optical element 211 and the aspheric shape fb(x,y) in the optical element 212 completely coincide with each other (that is, fa-fb is a constant). Therefore, the optical element group that includes the optical element 211 and the optical element 212 does not have the optical power but work as a plane parallel plate. It is preferable that the distance between the aspheric surface 211b and the aspheric surface 212b in the optical axis direction is smaller. For example, the value is typically about 10-100 μm.

In the embodiment, the optical element 211 is considered to be driven by a distance δx in the x-axis direction (the first direction). In this case, a change of the total thickness of the optical element 211 and the optical element 212 is represented by the following EQUATION 2.

[EQUATION 2]

$$f_a(x+\delta x, y) - f_b(x,y) = g(x+\delta x)g(x) + (C_a - C_b) \quad (2)$$

Next, when the Taylor series is performed for g(x+δx) around x+δx=x, the following EQUATION 3 is obtained.

[EQUATION 3]

$$g(x+\delta x) = g(x) + g'(x)\delta x + \frac{g''(x)\delta x^2}{2} + \ldots \quad (3)$$

In the expression, g'(x) denotes a first-order differential of g(x) at x, and g''(x) denotes a second-order differential of g(x) at x.

Furthermore, when terms including a higher order of δx than a second-order are regarded as infinitesimal and are ignored, EQUATION 2 is changed as the following EQUATION 4.

[EQUATION 4]

$$f_a(x+\delta x,y) - f_b(x,y) = g'(x)\delta x + (C_a - C_b) \quad (4)$$

In other words, the optical element group 21 has an aspheric shape in which the change of the total thickness between the optical element 211 and the optical element 212 changes according to g'(x)δx when the optical element 211 is driven by the distance δx in the x-axis direction.

The optical element group 21 faces the reticle 101, and is arranged in a telecentric optical path. Therefore, light passing through the optical element group 21 is refracted in a direction proportional to a local change of the total thickness of the optical elements 211 and 212, and a distortion is generated in that direction. In other words, a distortion change in the x-axis direction of the projection optical system 100 is proportional to a partial differential value of EQUATION 4 with respect to x, and a distortion change in the y-axis direction is proportional to a partial differential value of EQUATION 4 with respect to y. When the distortion change in the x-axis direction is defined as dx, the distortion change in the y-axis direction is defined as dy, and a proportional constant is defined as C, the following EQUATION 5 is derived.

[EQUATION 5]

$$dx = Cg''(x)\delta x \quad (5a)$$

$$dy = 0 \quad (5b)$$

Here, dy is equal to 0 because there is no term depending on y even if EQUATION 4 is partially differentiated at y. Therefore, the distortion changes represented by EQUATIONS 5a and 5b are generated in the projection optical system 100 when the optical element 211 is driven by the distance δx in the x-axis direction.

Next, a case where the optical element 211 is driven by a distance δy in the y-axis direction (the second direction) is considered. In this case, a change of the total thickness of the optical element 211 and the optical element 212 is represented by the following EQUATION 6.

[EQUATION 6]

$$f_a(x,y+\delta y) - f_b(x,y) = h(y+\delta y) - h(y) + (C_a - C_b) \quad (6)$$

Similarly to the case where the optical element 211 is driven in the x-axis direction, when the Taylor series is performed for h(y+δy) around y+δy=y and terms including a higher-order of δy than a second-order are regarded as infinitesimal and are ignored, the following EQUATION 7 is obtained.

[EQUATION 7]

$$f_a(x,y+\delta y) - f_b(x,y) = h'(y)\delta y + (C_a - C_b) \quad (7)$$

In EQUATION 7, h'(y) denotes a differential of h(y) at y.

In other words, when the distortion change in the x-axis direction is defined as dx, the distortion change in the y-axis direction is defined as dy, and the proportional constant is defined as C, the following EQUATION 8 is derived.

[EQUATION 8]

$$dx = 0 \quad (8a)$$

$$dy = Ch''(y)\delta y \quad (8b)$$

In EQUATION 8, h''(y) denotes a second-order differential of h(y) at y.

Therefore, the distortion changes represented by EQUATIONS 8a and 8b are generated in the projection optical system 100 when the optical element 211 is driven by the distance δy in the y-axis direction.

Moreover, a case where the optical element 211 is driven by the distance δx in the x-axis direction and is also driven by the distance δy in the y-axis direction is considered. In this case, a change of the total thickness of the optical element 211 and the optical element 212 is represented by the following EQUATION 9.

[EQUATION 9]

$$f_a(x+\delta x, y+\delta y) - f_b(x,y) = g(x+\delta x) - g(x) + h(y+\delta y) - h(y) + (C_a - C_b) \quad (9)$$

When calculating as described above, the distortion change in the projection optical system 100 is represented by the following EQUATION 10.

[EQUATION 10]

$$dx = Cg''(x)\delta x \quad (10a)$$

$$dy = Ch''(y)\delta y \quad (10b)$$

In other words, the distortion changes represented by EQUATIONS 10a and 10b are generated in the projection optical system 100 when the optical element 211 is driven by the distance δx in the x-axis direction and is also driven by the distance δy in the y-axis direction.

As described above, the distortion change dx that is generated when being driven by the distance δx in the x-axis direction is proportional to g''(x) obtained by the second-order differential of g(x). The distortion change dy that is generated when being driven by the distance δy in the y-axis direction is proportional to h''(y) obtained by the second-order differential of h(y). In other words, the optical element group 21 is formed so that g(x) and h(y) in the aspheric surfaces 211b and 212b become appropriate functions to be able to control distortions different from each other, which correspond to the cases of being driven in the x-axis direction and in the y-axis direction, respectively. Moreover, the driven distances δx and δy of the optical element 211 are changed to be able to freely change the amount of the distortion change.

The present invention focuses attention on that the amounts of higher-order distortions and rotationally asymmetric distortions, which are caused by the absorption of exposure light, are small, and uses the optical elements 211 and 212 having small aspheric surface amounts. Therefore, the optical elements 211 and 212 in this embodiment can perform the correction of the distortions without affecting the other optical characteristics. For this reason, the present invention may be used as the corrector for correcting an error of an aberration correction by a known aberration corrector.

This embodiment has been described the case where the optical element 211 is driven in the x- and y-axis directions, but the optical element 212 may be driven as long as a relative position between the optical elements 211 and 212 is changed.

Moreover, it is also allowed that the optical element 211 is driven by δx in the x-axis direction and by δy in the y-axis direction and the optical element 212 is driven by −δx in the x-axis direction and by −δy in the y-axis direction. Thus, it is possible that either the driven distance in one optical element or the aspheric surface amount is reduced to half when obtaining the same amount of the distortion change as above. These provide results of reducing a space located in the controller 103, improving position accuracy, and halving an aspheric amount.

Next, embodiment 1 of the present invention will be described in detail by giving a specific value to g(x) and h(y).

Figure 4:
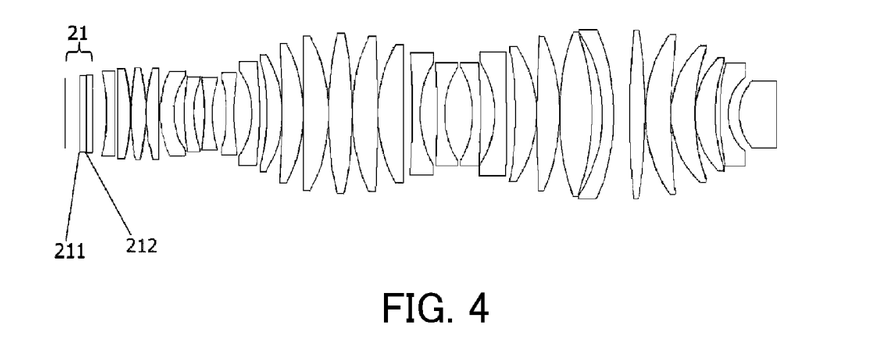
FIG. 4 is a cross-sectional diagram of a projection optical system in embodiments of the present invention.
Figure 10:
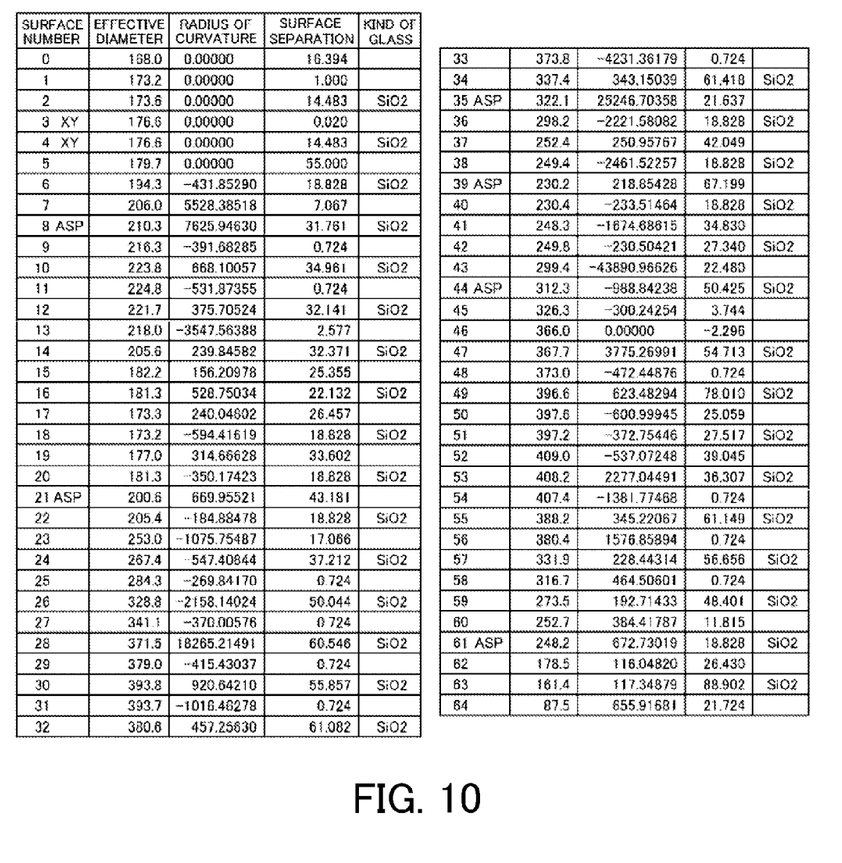
FIG. 10 shows an effective diameter, a radius of curvature, a surface interval, and the kind of glass in each surface of a projection optical system in embodiments of the present invention.

FIG. 4 shows the projection optical system 100 in embodiment 1. In this projection optical system 100, KrF excimer laser having a wavelength of 248 nm is used, a numerical aperture is 0.78, a projection magnification is −¼, and an exposure area is a rectangular of 26×33 mm. FIG. 10 shows an effective diameter, a radius of curvature, a surface separation, and the kind of glass in each surface of this projection optical system.

Figure 11:
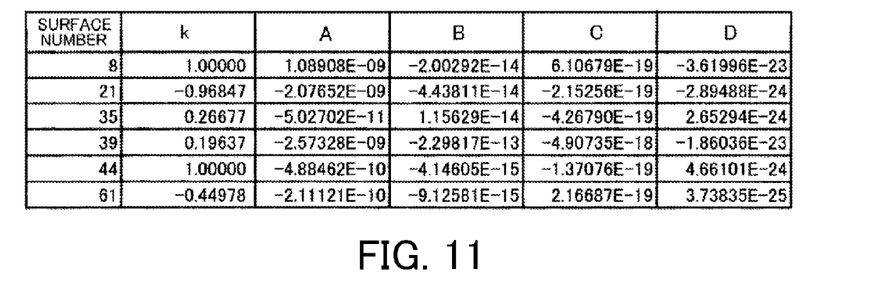
FIG. 11 shows a Korenich coefficient and an aspheric coefficient of a rotationally-symmetric aspheric surface of a projection optical system in embodiments of the present invention.

In FIG. 10, $SiO_2$ denotes a synthetic quartz. The refractive index of the synthetic quartz in the wavelength 248 nm is 1.50839. Moreover, in FIG. 10, ASP denotes rotationally symmetric aspheric surfaces. These rotationally symmetric aspheric surfaces have a Korenich coefficient and an aspheric coefficient shown in FIG. 11. In FIG. 11, A is a coefficient of a term proportional to the fourth power of the distance r from the center, B is a coefficient of a term proportional to the sixth power of r, C is a coefficient of a term proportional to the eighth power of r, and D is a coefficient of a term proportional to the tenth power of r. Furthermore, XY in FIG. 10 denotes rotationally asymmetric aspheric surfaces. These rotationally asymmetric aspheric surfaces have surface shapes represented by high-degree polynomials in x and y. These surface shapes are described below.

This projection optical system 100 corrects the rotationally asymmetric distortion by using the optical element group 21 that includes the optical elements 211 and 212 in the telecentric optical path from the reticle to the first lens. In the embodiment, the distance between the optical elements 211 and 212 is 20 μm.

Embodiment 1 will be described using this projection optical system. In the embodiment, aspheric shapes of the optical elements 211 and 212 are formed so as to have shapes satisfying the following EQUATION 11.

[EQUATION 11]

$$f(x,y) = C_{10}x + C_{30}x^3 + C_{01}y + C_{05}y^5 \quad (11)$$

$C_{10} = -4.90e-05$ $C_{30} = 2.00e-08$ $C_{01} = -3.50e-05$ $C_{05} = 2.00e-12$

EQUATION 11 includes a first-order term $C_{10}x$ in x and a first-order term $C_{01}y$ in y. These terms vanish in a process of partially differentiating with reference to x or y, and therefore does not affect the distortion change that is eventually to be generated. However, it is possible to minify an absolute value of a gap between the formed aspheric surface and a planer surface (aspheric amount) due to these terms. By minifying the aspheric amount, the projection optical system can reduce an influence exerted to an optical performance of the projection optical system, and can improve a processing accuracy. Furthermore, it becomes possible to use the surface shape measurement apparatus using an interferometer or the like in performing the measurement. Therefore, it is effective to provide a value to these terms on purpose like this embodiment.

Figure 5:
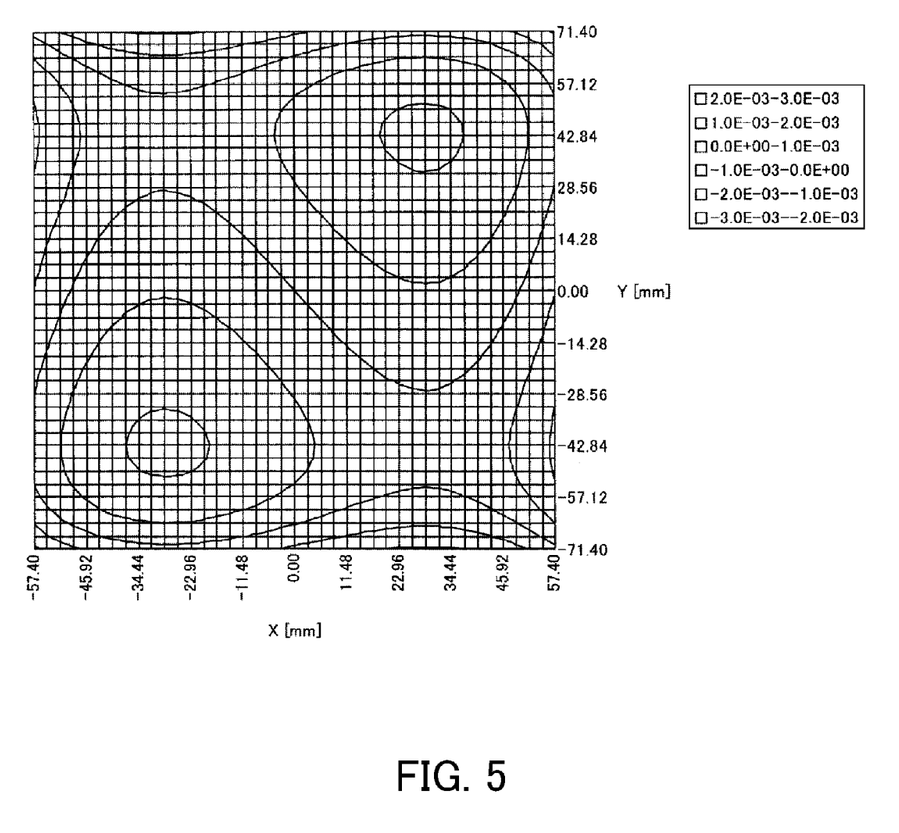
FIG. 5 is a graph that shows an aspheric shape of an optical element in embodiment 1 of the present invention.

FIG. 5 shows the aspheric shape provided by EQUATION 11 by using contour lines. When the first-order terms in x or y are not used, the gap between the aspheric surface and the planar surface reaches ±7.49 μm. However, this embodiment succeeds in decreasing the gap between the aspheric surface and the planar surface to ±2.18 μm by providing an appropriate value to $C_{10}$ and $C_{01}$.

Figure 6A:
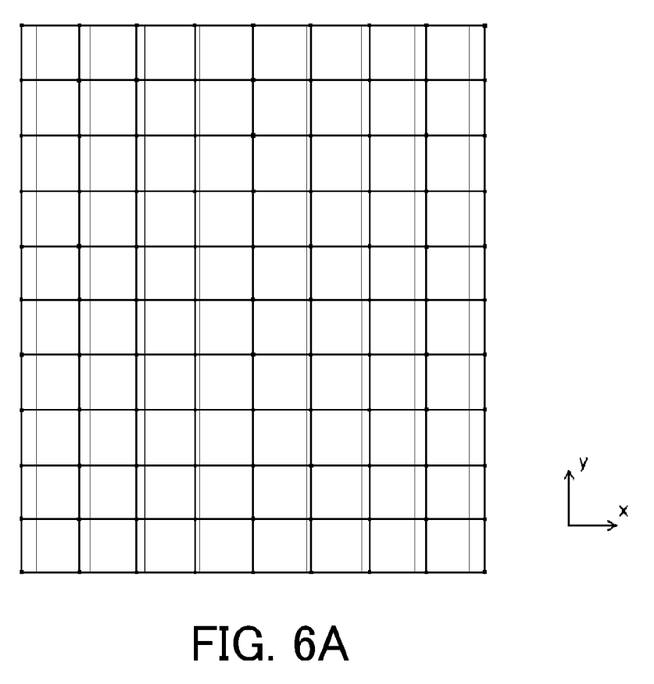
FIGS. 6A and 6B show a distortion change due to a movement of an optical element in embodiment 1.

FIG. 6A shows the distortion change generated in the projection optical system 100 when driving the optical element 211 by −1 mm in the x-axis direction and driving the optical element 212 by +1 mm in the x-axis direction. FIG. 6A shows a state where the whole image plane deforms as a lattice drawn by thick lines with respect to an ideal lattice of 26×33 mm drawn by thin lines. In FIG. 6A, for easy understanding of the tiny distortion, the plot is emphasized by 20,000 times as large as an actual change. As shown in FIG. 6A, the magnification change is generated in only the x-axis direction of the projection optical system 100, the distortion change when converting into the rotationally asymmetric magnification is 1.67 ppm, and the distortion change amount is 43.8 nm at a periphery of x=13 mm. The distortion change in the y-axis direction of the projection optical system 100 is nearly equal to 0. In short, the optical element 211 and the optical element 212 in FIG. 6A generate a rotationally asymmetry magnification change. The rotationally asymmetric magnification is a kind of rotationally asymmetric distortion and means a component that deforms so that an elongation ratio is different between a horizontal direction and a vertical direction. Specifically, the change amount dx, dy at x, y are represented as dx=axx, dy=−axy. In addition, ppm denotes $10^{-6}$.

Figure 6B:
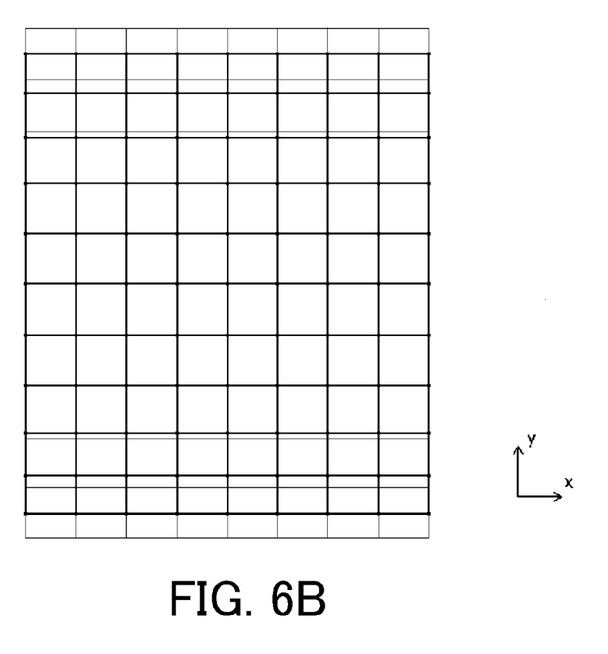

FIG. 6B shows the distortion change generated in the projection optical system 100 of when the optical element 211 is driven by −1 mm in the y-axis direction and the optical element 212 is driven by +1 mm in the y-axis direction. FIG. 6B can be seen by the same way as that of FIG. 6A. As can be seen from FIG. 6B, a third-order distortion change is generated in only the y-axis direction, and this amount is 80.8 nm at a periphery of y=16.5 mm. The distortion change in the y-axis direction is nearly equal to 0.

Thus, different types of distortion changes that respectively correspond to a case where the optical elements 211 and 212 are driven in the x-axis direction and a case where the optical elements 211 and 212 are driven in the y-axis direction are generated in the projection optical system 100. Therefore, an advanced distortion correction becomes possible by combining the drive in the x-axis direction and the drive in the y-axis direction.

Furthermore, a more effective correction becomes possible by using both known correctors of the rotationally symmetric magnification and the symmetric third-order distortion as described above.

Figure 7A:
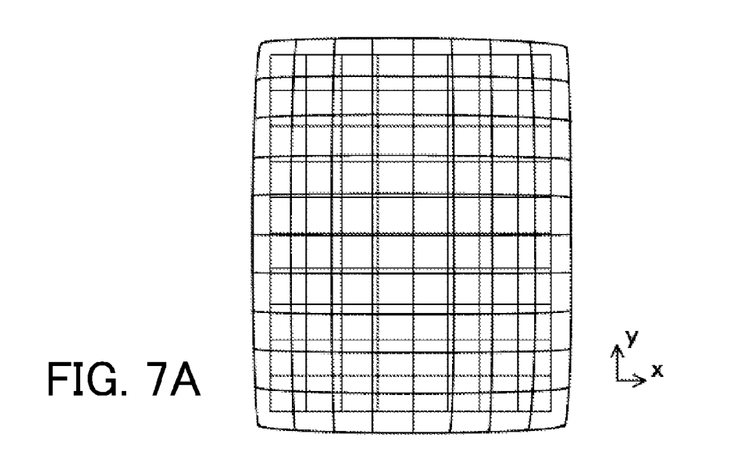
FIG. 7 shows a correction of a distortion due to heat in a projection optical system in embodiment 1.

For example, FIG. 7A shows the distortion change caused in projection optical system 100 that is calculated by a heat aberration simulation. The plotted magnification is 20,000 times, which is the same as above. The distortion change up to 82.5 nm is caused due to heat absorption of a lens, which is in a state where a correction is required.

Figure 7B:
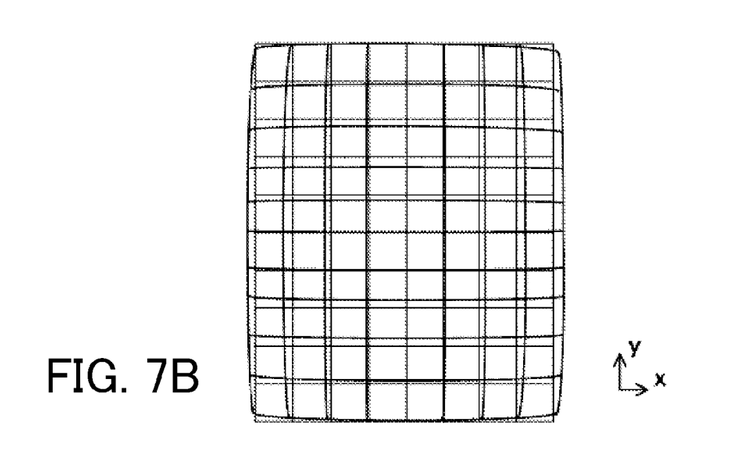

FIG. 7B shows the distortion change corrected by the known correctors of the rotationally symmetric magnification and the symmetric third-order distortion. For easy viewability of the tiny distortion change, FIG. 7B is depicted by a plotted magnification of 100,000 times as large as an actual change. According to this, the correction rest error of 9.4 nm remains if the distortion in FIG. 7A is corrected by using only the known correctors of the rotationally symmetric magnification and the symmetric third-order distortion.

Figure 7C:
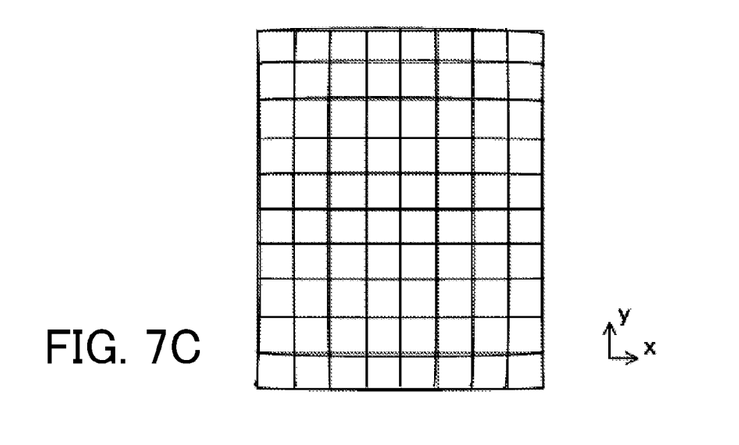

On the other hand, FIG. 7C shows a state where the distortion in FIG. 7A is corrected by combining the known correctors with the optical element group 21 in this embodiment, which can generate the magnification change in the x-axis direction and the third-order distortion in the y-axis direction. The plotted magnification is 100,000 times which is the same as that of FIG. 7B. As a result, the rotationally asymmetric correction is capable of reducing the correction rest error up to 2.6 nm, which is effective in performing the correction.

The above correction of the distortions in the x- and y-axis directions can also be used for a correction of a distortion matching between two or more apparatuses, a distortion matching in a plurality of exposure modes, a correction of reticle manufacturing error, or the like, in addition to the correction of the error caused by the wafer process. In these situations, the correction amount of the rotationally asymmetric (anisotropic) magnification is several ppms. In this correction amount, parameters are set by a method such as manually inputting data to the exposure apparatus, and the relative position of optical elements 211 and 212 is adjusted by the controller 103 based on the set parameter to perform the setting of the apparatus. The setting of the parameters can also be performed by directly inputting a value automatically measured to the exposure apparatus.

This embodiment has described the case where the optical element 211 is driven in both the x- and the y-axis directions, but it is also applicable to a case where one of the optical element 211 and the optical element 212 is driven in the x-axis direction and the other is driven in the y-axis direction. Thus, a driven direction where the controller 103 drives each of the optical elements 211 and 212 only in one direction, and therefore the controller 103 can be configured with the simple mechanism. Moreover, when the driven direction is only one direction, a position accuracy is improved and the generation of an unnecessary aberration component is suppressed.

In the embodiment, the distortion component which can be corrected by using the present invention is not limited to the asymmetric magnification and the rotationally asymmetric third-order distortion, and anything that can be corrected by designing g(x) and h(y) is acceptable.

Embodiment 2

Next, Embodiment 2 of the present invention will be described. Because a mechanical arrangement of embodiment 2 is similar to that of embodiment 1, it will be explained by referring to the same drawings. Moreover, the description that overlaps with that of the embodiment 1 is omitted. Although a basic configuration of this embodiment is similar to that of embodiment 1, the relative positions of the optical elements 211 and 212 are changed in the optical axis direction (z-axis) and in the direction orthogonal to the optical axis direction (x-axis and y-axis) by the controller 103.

An aspheric shape included in the optical element group 21 of embodiment 2 will be described.

When the aspheric shape of the optical element 211 is denoted as fa(x, y) and the aspheric shape of the optical element 212 is denoted as fb(x, y), the following EQUATION 12 is given.

[EQUATION 12]

$$f_a(x,y)=g(x)+h(y)+(ax^2+bxy+cy^2)+C_a \quad (12a)$$

$$f_b(x,y)=g(x)+h(y)+(ax^2+bxy+cy^2)+C_b \quad (12b)$$

In EQUATION 12, g(x) denotes a function whose the variable is only x, h(y) denotes a function whose the variable is only y, and a, b, c, Ca, and Cb denote constant terms. Here, neither g(x) nor h(y) includes the second-order and first-order power functions.

Next, a case where the optical element 211 is driven by a distance δx in the x-axis direction is considered. In this case, a change of the total thickness of the optical elements 211 and 212 is represented as the following EQUATION 13.

[EQUATION 13]

$$f_a(x+\delta x,y)-f_b(x,y)=g(x+\delta x)-g(x)+a(2x\delta x+\delta x^2)+by\delta y+(C_a-C_b) \quad (13)$$

Here, when the Taylor expansion is performed for g(x+δx) around x+δx=x, and terms including a higher-order of δx than a second-order are regarded as infinitesimal and are ignored, EQUATION 13 is represented as the following EQUATION 14.

[EQUATION 14]

$$f_a(x+\delta x,y)-f_b(x,y)=g'(x)\delta x+\delta x(2ax+by)+(C_a-C_b) \quad (14)$$

In other words, the optical element group 21 has an aspheric shape where the total thickness of the optical elements 211 and 212 changes according to EQUATION 14.

The optical element group 21 faces the reticle 101, and is arranged in the telecentric optical path. Therefore, light passing through the optical element group 21 is refracted in a direction proportional to a local change of the total thickness of the optical elements, and the distortion is generated in this direction. In other words, the distortion change in the x-axis direction in the projection optical system 100 is proportional to a partial differential value of EQUATION 14 at x, and the distortion change in the y-axis direction is proportional to a partial differential value of EQUATION 14 at y. When the distortion change in the x-axis direction is denoted as dx, the distortion change in the y-axis direction is denoted as dy, and a proportional constant is denoted as $C_1$, the following EQUATION 15 is obtained.

[EQUATION 15]

$$dx=C_1(g''(x)\delta x+2a\delta x) \quad (15a)$$

$$dy=C_1 b\delta y \quad (15b)$$

Therefore, the distortion changes represented by EQUATIONS 15a and 15b are generated in the projection optical system 100 when the optical element 211 is driven by the distance δx in the x-axis direction.

The term 2aδx included in dx and the term bδx included in dy are constant times of δx, and are uniform components without components that change in the image area. As a result, an influence can be completely ignored by a well-known method such as a method of moving the wafer stage. Therefore, a term that has a meaning in EQUATION 15 is only g''(x)δx included in dx.

Next, a case where the optical element 211 is driven by a distance δy in the y-axis direction is considered. In this case, the change of the total thickness of the optical elements 211 and 212 is represented as the following EQUATION 16.

[EQUATION 16]

$$f_a(x,y+\delta y)-f_b(x,y)=h(y+\delta y)-h(y)+bx\delta x+c(2y\delta y+\delta y^2)+(C_a-C_b) \quad (16)$$

Similarly to the above case, when the Taylor expansion of h(y+δy) is performed around y+δy=y and terms including a higher-order of δy than a second-order are regarded as infinitesimal and are ignored, the following EQUATION 17 is obtained.

[EQUATION 17]

$$f_a(x,y+\delta y)-f_b(x,y)=h'(y)\delta y+(bx+3cy)\delta y+(C_a-C_b) \quad (17)$$

When the distortion change in the x-axis direction in the projection optical system 100 is denoted as dx, the distortion change in the y-axis direction is denoted as dy, and a proportional constant is denoted as $C_1$, EQUATION 17 is represented as the following EQUATION 18.

[EQUATION 18]

$$dx=C_1 b\delta x \quad (18a)$$

$$dy=C_1(h''(y)\delta y+2c\delta y) \quad (18b)$$

Therefore, the distortion changes represented by EQUATIONS 18a and 18b are generated in the projection optical system 100 when the optical element 211 is driven by the distance δy in the y-axis direction. The term bδy included in dx and the term 2cδy included in dy are uniform components without components that change in the image area. As a result, the influence can be completely ignored by a well-known method, such as a method of moving a wafer stage. In this case, a term that has a meaning in EQUATION 18 is only h''(x)δy included in dy.

Next, a case where the optical element 211 is driven by a distance δz in z-axis direction (optical axis direction, third direction) is considered. In this case, a total thickness of the optical element 211 and the optical element 212 does not change and therefore an optical power does not change.

Figure 3:
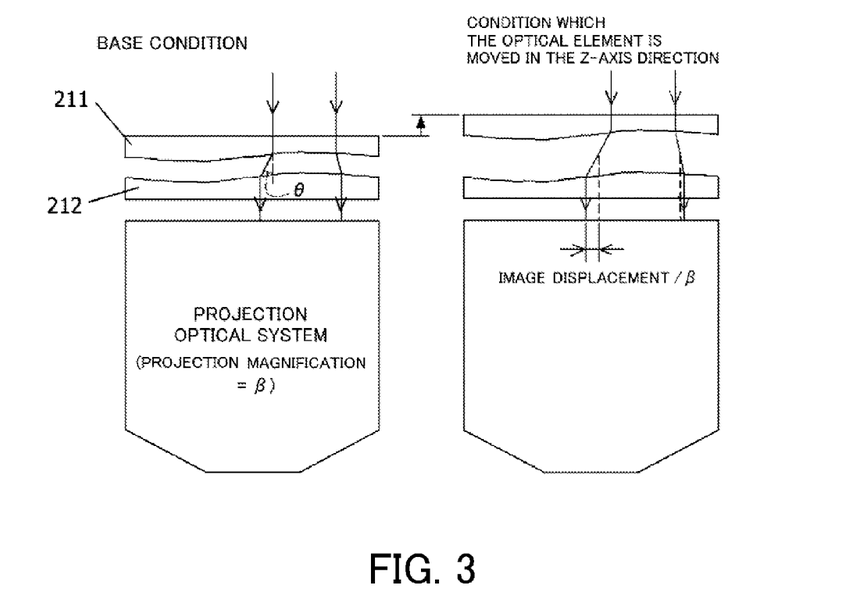
FIG. 3 shows a projection optical system that drives an optical element in a z-axis direction in embodiment 2 of the present invention.

This optical element group 21 is arranged so as to face the reticle 101 in the telecentric optical path. Therefore, as shown in FIG. 3, light passing through the optical element group 21 is refracted by the aspheric surface 211b, passes in that direction by the infinitesimal distance, and then is refracted by the aspheric surface 212b to be returned in the telecentric optical path.

In the embodiment, a case where the distance between the optical elements 211 and 212 in the optical axis direction is changed by driving the optical element 211 in the z-axis direction is considered. In this case, as shown in FIG. 3, if the distance that light passes after being refracted by the aspheric surface 211b slightly changes, the distortion change according to the slight change is generated in the projection optical system 100. The distortion change amount (image displacement amount) is proportional to a tangent (tan) of a refraction angle θ of when the light is refracted by the aspheric surface 211b. Moreover, a local inclination of the surface is proportional to a sine (sin) of the refraction angle θ. Here, when θ is small, the following EQUATION 19 is obtained.

[EQUATION 19]

$$\sin\theta \simeq \tan\theta \simeq \theta \quad (19)$$

Thus, the distortion change is found to be proportional to a local inclination of the surface. In other words, the distortion change is proportional to a first-order differential of the aspheric shape. In the projection optical system 100, the distortion change dx in the x-axis direction is proportional to a partial differential value of EQUATION 12 at x, and the distortion change dy in the y-axis direction is proportional to a partial differential value of EQUATION 12 at y. Therefore, when a proportional constant is denoted as $C_2$, the following EQUATION 20 is obtained.

[EQUATION 20]

$$dx = C_2 \delta z (g'(x) + 2ax + by) \tag{20a}$$

$$dy = C_2 \delta z (h'(y) + bx + 2cy) \tag{20b}$$

In EQUATION 20a, dx includes a distortion change component denoted by $g'(x)$ and a distortion change component denoted by $2ax+by$. Therefore, when $g'(x)$ and $2ax+by$ are compared at maximum values of absolute values in the image area, $g(x)$, a, and b are defined so that the following EQUATION 21 is satisfied.

[EQUATION 21]

$$\max(|g'(x)|) \ll \max(|2ax+by|) \tag{21}$$

As a result, in the distortion change that is generated by being driven in the z-axis direction in the projection optical system 100, a predominant component is $2ax+by$, and a contribution in $g'(x)$ is almost ignorable. However, in EQUATION 21, max ($|\xi|$) means that the absolute value of $\xi$ takes a maximum value in the image area.

Moreover, the same applies to EQUATION 20b, and therefore $h(y)$, b, and c are selected so that the following EQUATION 22 is satisfied.

[EQUATION 22]

$$\max(|h'(y)|) \ll \max(|bx+2cy|) \tag{22}$$

As a result, in the distortion change that is generated by being driven in the z-axis direction in the projection optical system 100, a predominant component is $bx+2cy$, and a contribution in $h'(y)$ is almost ignorable. That is, EQUATION 20 can be substantially regarded as the following EQUATION 23 by designing the aspheric surfaces 211b and 212b so as to satisfy EQUATIONS 21 and 22.

[EQUATION 23]

$$dx \cong C_2 \delta z (2ax+by) \tag{23a}$$

$$dy \cong C_2 \delta z (bx+2cy) \tag{23b}$$

Moreover, a case where the optical element 211 is driven by the distance $\delta x$ in the x-axis direction, by the distance $\delta y$ in the y-axis direction, and by the distance $\delta z$ in the z-axis direction (optical direction) is considered. In this case, a distortion change generated in the projection optical system 100 is denoted as the following EQUATION 24 in view of the EQUATIONS 15, 18 and 20.

[EQUATION 24]

$$dx = C_1(g''(x)\delta x + 2a\delta x + b\delta y) + C_2 \delta z(g'(x) + 2ax + by) \tag{24a}$$

$$dy = C_1(h''(y)\delta y + 2c\delta y + b\delta x) + C_2 \delta z(h'(y) + bx + 2cy) \tag{24b}$$

Here, the known uniform component $2a\delta x+b\delta y$ in the image area that is included in dx and the known uniform component $2c\delta y+b\delta x$ in the image area that is included in dy can be corrected by a method of moving the wafer stage or the like, and are substantially ignorable in EQUATION 24. Furthermore, the above description with regard to EQUATION 21 and EQUATION 22 is applied to the EQUATION 24. In other words, $g'(x)$ is ignored as much smaller than $2ax+by$ and $h'(y)$ is ignored as much smaller than $bx+2cy$. As a result, EQUATION 24 is represented by the following EQUATION 25.

[EQUATION 25]

$$dx \cong C_1 g''(x)\delta x + C_2 \delta z(2ax+by) \tag{25a}$$

$$dy \cong C_1 h''(y)\delta y + C_2 \delta z(bx+2cy) \tag{25b}$$

Therefore, the distortion changes represented by EQUATIONS 25a and 25b are generated in projection optical system 100 when the optical element 211 is driven by the distance $\delta x$ in the x-axis direction, by the distance $\delta y$ in the y-axis direction, and by the distance $\delta z$ in the z-axis direction (optical direction).

A distortion change that is generated when being driven in the x-axis direction is proportional to $g''(x)$, a distortion change that is generated when being driven in the y-axis direction is proportional to $h''(y)$, and a distortion change that is generated when being driven in the z-axis direction is proportional to a first order polynomial in x and y that has coefficients a, b, and c. In other words, the optical element group 21 is formed so that $g(x)$, $h(y)$, and $ax^2+bxy+cy^2$ in the aspheric surfaces 211b and 212b become appropriate functions to be able to control each of different distortions. In other wards, this embodiment can control each of different distortions corresponding to cases where the optical element 211 is driven in the x-, y-, and z-axis directions, respectively. In addition, the distances $\delta x$, $\delta y$, and $\delta z$ of the optical element 211 are changed to be able to freely change the amount of the distortion change. Therefore, at least two of high-order distortions and rotationally asymmetric distortions can be corrected.

The present invention focuses attention on that the amounts of the higher-order distortions and the rotationally asymmetric distortions, which are caused by an exposure light absorption, are small, and uses the optical elements 211 and 212 with small aspheric amounts. Therefore, the optical elements 211 and 212 in this embodiment can perform only the correction of the distortions without affecting other optical characteristics. For this reason, the present invention may be used as the corrector for correcting an error of an aberration correction by a known aberration corrector.

This embodiment has described the optical element 211 being driven in the x- and y-axis directions, but the optical element 212 may be driven as long as relative positions of the optical elements 211 and 212 are changed. Moreover, it is also allowed that the optical element 211 is driven by $\delta x$ in the x-axis direction, $\delta y$ in the y-axis direction, and $\delta z$ in the z-axis direction, and that the optical element 212 is driven by $-\delta x$ in the x-axis direction, $-\delta y$ in the y-axis direction, and $-\delta z$ in the z-axis direction. As a result, it is possible that either the distance by which one optical element is driven or the change of the aspheric shape is reduced to half to obtain the same amount of distortion change as above.

Next, embodiment 2 of the present invention will be described in detail by giving specific values to $g(x)$ and $h(y)$.

Similarly to the case of embodiment 1, in the projection optical system 100, KrF excimer laser having a wavelength of 248 nm is used, a numerical aperture is 0.78, a projection magnification is $-\frac{1}{4}$, and an exposure area is a rectangular of 26×33 mm. FIG. 10 shows an effective diameter, a radius of curvature, a surface interval, and the kind of glass in each of surfaces of the projection optical system.

This projection optical system 100 has the optical element group 21 including the optical elements 211 and 222 in the telecentric optical path between the reticle and the first lens and corrects the rotationally asymmetric distortion change using the optical element group 21. In the embodiment, the distance between the optical elements 211 and 212 is 20 μm.

Here, aspheric shapes of the optical elements 211 and 212 are designed so as to satisfy the following EQUATION 26.

[EQUATION 26]

$$f(x,y)=C_{10}x+C_{50}x^5+C_{01}y+C_{07}y^7+C_{20}x^2+C_{02}y^2+C_{00} \qquad (26)$$

$C_{10}=-2.400e-05$ $C_{50}=3.000e-12$ $C_{01}=-1.680e-05$ $C_{07}=2.000e-16$ $C_{20}=2.000e-05$ $C_{02}=-2.000e-05$ $C_{00}=1.860e-02$

Figure 8:
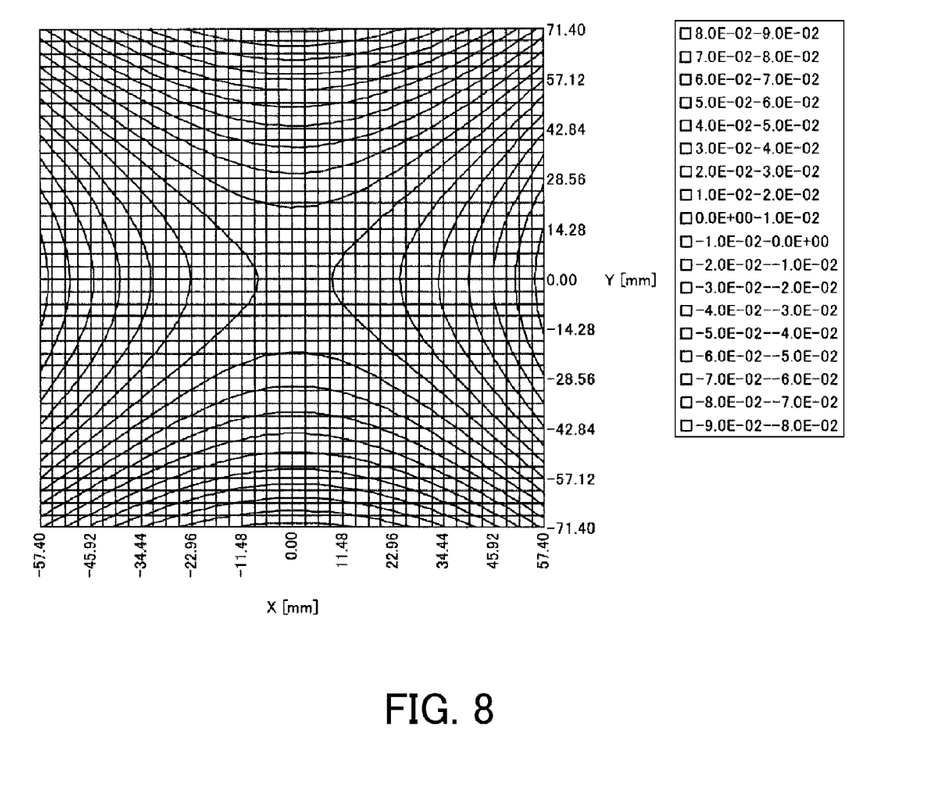
FIG. 8 is a graph that shows an aspheric shape of an optical element in embodiment 2 of the present invention.

FIG. 8 shows the aspheric shape provided by EQUATION 26 by contour lines. As shown in FIG. 8, the aspheric shape is entirely saddle shape because the coefficients $C_{20}$ and $C_{02}$ are larger than the other coefficients and provide predominant influence. The gap from the plane of the aspheric surface is ±85 μm.

Figure 9A:
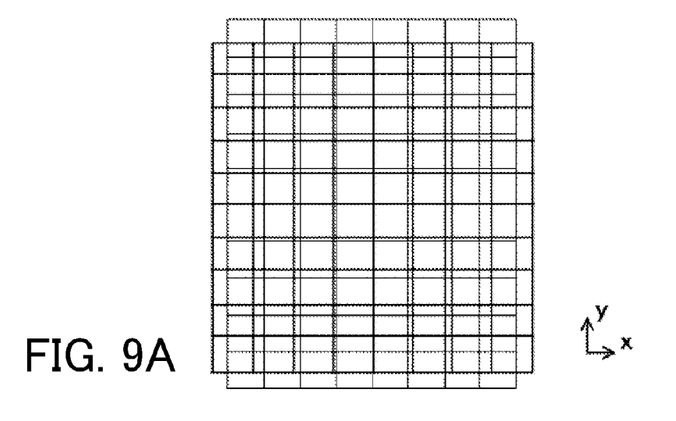
FIG. 9 shows a distortion change due to a movement of an optical element in embodiment 2.

FIG. 9A shows the distortion change generated in the projection optical system 100 when the optical element 211 is driven by +50 μm in the z-axis direction (optical axis direction) and the optical element 212 is driven by −50 μm in the z-axis direction. FIG. 9A can be seen by the same way as that of FIG. 6A, and the plotted magnification is 50,000 times. FIG. 9A shows an asymmetric magnification that expands in the x-axis direction and contracts in the y-axis direction. The asymmetric magnification is 2.07 ppm, and the distortion change amount is 38 nm at the image height y=16.5 mm that is a periphery of the image area.

The symmetric magnification and the shift of whole image area other than the above asymmetric magnification are slightly generated, but the symmetric magnification is 0.0004 ppm, the shift in the x-axis direction is 1.02 nm, and the shift in the y-axis direction is −0.86 nm, each of which is very small. These can be corrected by a known method and these do not affect the correction accuracy. Moreover, correction rest error by the known method is around 3.2 nm at most. In other words, the gap due to magnification change corresponding to 38 nm can be corrected by the correction accuracy of 3.2 nm.

Figure 9B:
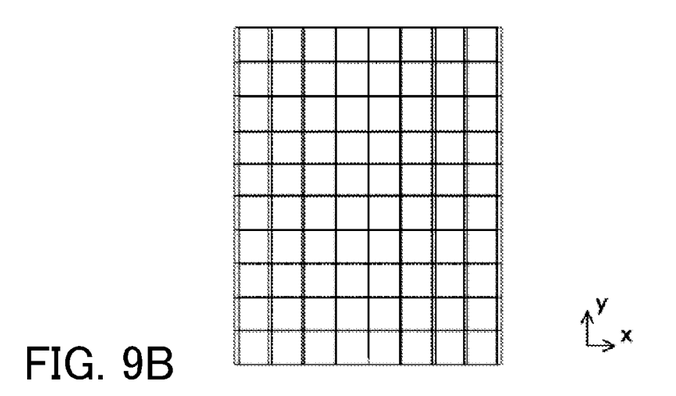

Next, this optical element 211 is driven by +100 μm in the x-axis direction and the optical element 212 is driven by −100 μm in the x-axis direction. In this case, the whole image area is shifted in the x-axis direction by −28.0 nm. FIG. 9B shows the distortion change that is generated in the projection optical system 100 after correcting this shift. A third-order distortion change that expands in the x-axis direction is generated as the third-order function, and the third-order distortion change amount is 10.5 nm at an image height x=13 mm that is a periphery of the image area. Therefore, correction rest error due to the third-order distortion change in the x-axis direction is around 1.6 nm at most.

Figure 9C:
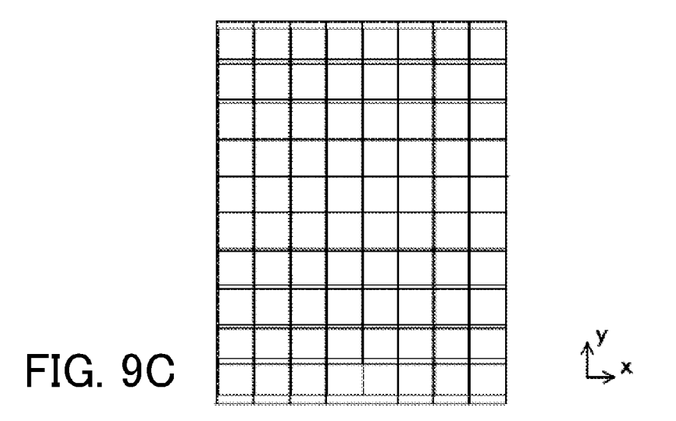

Next, the optical element 211 is driven by +100 μm in the y-axis direction and the optical element 212 is driven by −100 μm in the y-axis direction. In this case, the whole image area is shifted in the y-axis direction by 27.8 nm. FIG. 9C shows the distortion change that is generated in the projection optical system 100 after correcting this shift. A fifth-order distortion change that expands in the x-axis direction is generated as the fifth-order function, and the fifth-order distortion change amount is 15.6 nm at an image height y=16.5 mm that is a periphery of the image area. Therefore, correction rest error due to the fifth-order distortion change in the y-axis direction is around 1.5 nm at most.

As described above, it is possible that the distortions are finely corrected by combining the asymmetric magnification, the third-order distortion in the x-axis direction, the fifth-order distortion in the y-axis direction, and the rotationally asymmetric magnification and the asymmetric third-order distortion that can be collected by the known correctors.

Due to the recent growth in size of an image area, the distortion shape caused by heat is getting complicated. In such an exposure apparatus, this embodiment can correct a plurality of rotationally asymmetric distortions that cannot be corrected by the known correctors.

This embodiment has described a case of combining three types of rotationally asymmetric distortion changes of the asymmetric magnification, the third-order distortion change in the x-axis direction, and the fifth-order distortion change in the y-axis direction, but any other types of rotationally asymmetric distortion changes may be combined.

This embodiment has described a case where the optical element 211 is driven in all of the x-, y- and z-axis directions, but it is also allowed that either the optical element 211 or the optical element 212 is driven in one or two of the x-, y- and z-axis directions and the other is driven in the other directions. This can reduce driven directions in which the controller 103 drives the optical elements 211 and 212, and therefore the mechanism of the controller 103 is simplified. Moreover, if the driven directions are fewer, a position accuracy improves and an emergence of unnecessary aberration components is suppressed.

None of the three degrees of freedom in the x-, y-, and z-axis directions has to be used for the correction during the exposure process. For example, it is allowed that a drive in the z-axis direction is manually performed as an adjustor when assembling or setting the projection optical system 100 and that drives in the x- and y-axis directions are mechanically performed as a corrector during the exposure process. This simplifies a drive mechanism and has an advantage on accuracy.

In the embodiments of the present invention, the distortion change with respect to heat absorption amount of the projection optical system may be previously obtained by a simulation or an experiment to estimate and corrected the distortion change amount caused by a heat generated when manufacturing a semiconductor device based on a given heat amount. The correction may also be performed while actually measuring the magnification change during the exposure process. The present invention can also be applied to these cases without any problem.

Moreover, the embodiments of the present invention have described examples of the projection optical system in which the KrF excimer laser is used as a light source, but the light source is not limited to the KrF excimer laser and a projection optical system using other wavelengths such as ArF excimer laser and i line mercury lamp may be used. Furthermore, the embodiments have indicated the effect in a stepper exposure apparatus having an exposure area of 26×33 mm, but a step and scan exposure apparatus including a slit exposure area, what is called the scanner exposure apparatus, may be used.

In addition, the aspheric amount and the driven amount of the optical element in embodiments 1 and 2 of the present invention are merely one example. The proportional relation is satisfied between the distortion change amount and the aspheric amount or between the distortion change amount and the driven amount of the optical element. Therefore, the aspheric amount and the driven amount of an optical element may be set appropriately when constituting the optical element group 21 considering limitations of the drive mechanism or a situation of the aspheric fabrication.

A method of manufacturing a device, such as a semiconductor integrated circuit device and a liquid crystal display device, includes the step of exposing the photosensitive agent applied substrate, such as a wafer and a glass plate, using the above exposure apparatus, the step of developing the substrate, and the other well-known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-009334, filed on Jan. 19, 2009, which is hereby incorporated by reference herein in its entirety.

What is claimed is:

1. A projection optical system for projecting a pattern of a mask onto a substrate, the projection optical system comprising:
   a pair of optical elements that includes a first optical element having a first aspheric surface and a second optical element having a second aspheric surface,
   wherein the first aspheric surface and the second aspheric surface have a complementary relationship with each other and are arranged facing each other,
   wherein the first aspheric surface and the second aspheric surface are curved in a first direction and a second direction orthogonal to the first direction,
   wherein the first direction and the second direction each are orthogonal to an optical axis of the projection optical system,
   wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and
   wherein the first distortion of the projection optical system is anisotropic between the first direction and the second direction.

2. A projection optical system according to claim 1, wherein the first direction is an x-axis direction orthogonal to an optical axis direction of the projection optical system, and the second direction is a y-axis direction orthogonal to the optical axis direction and the x-axis direction.

3. A projection optical system according to claim 2, wherein a shape fa(x, y) of the first aspheric surface and a shape fb(x, y) of the second aspheric surface are represented as follows:

$$fa(x,y)=g(x)+h(y)+Ca; \text{ and}$$

$$fb(x,y)=g(x)+h(y)+Cb,$$

where:
   g(x): a function whose variable is only x,
   h(y): a function whose variable is only y, and
   Ca, Cb: constant.

4. A projection optical system according to claim 1, wherein:
   the first distortion is a distortion generated in only the first direction, and
   the second distortion is a distortion generated in only the second direction.

5. A projection optical system according to claim 2, wherein a shape fa(x, y) of the first aspheric surface and a shape fb(x, y) of the second aspheric surface are represented as follows:

$$fa(x,y)=g(x)+h(y)+ax2+bxy+cy2+Ca; \text{ and}$$

$$fb(x,y)=g(x)+h(y)+ax2+bxy+cy2+Cb,$$

where:
   g(x): a function whose variable is only x except a second-order and a first-order power functions,
   h(y): a function whose variable is only y except a second-order and a first-order power functions,
   Ca and Cb: constant, and
   a, b, and c: constant except the case of satisfying a=b=c=0.

6. A projection optical system according to claim 5, wherein the relative position between the first aspheric surface and the second aspheric surface in the optical axis direction changes.

7. A projection optical system according to claim 6, wherein the first distortion in the first direction and the second distortion in the second direction are generated by changing the relative position in the optical axis direction.

8. A projection optical system according to claim 1, wherein the first optical element moves only in the first direction and the second optical element moves only in the second direction.

9. A projection optical system according to claim 1, wherein the optical performances include a rotationally asymmetric distortion.

10. A projection optical system according to claim 1, wherein the pair of optical elements are arranged to face the mask.

11. A projection optical system according to claim 1, wherein an order of the first distortion generated by changing the relative position between the first aspheric surface and the second aspheric surface in the first direction is different from an order of the second distortion generated by changing the relative position between the first aspheric surface and the second aspheric surface in the second direction.

12. A projection optical system according to claim 1, wherein:
   the first distortion in the first direction is only generated by changing the relative position between the first aspheric surface and the second aspheric surface in the first direction, and
   the second distortion in the second direction is only generated by changing the relative position between the first aspheric surface and the second aspheric surface in the second direction.

13. A projection optical system according to claim 1, wherein the first distortion is magnification.

14. An exposure apparatus comprising:
   an illumination optical system configured to illuminate a pattern of a mask; and
   a projection optical system configured to project the pattern of the mask onto a substrate, wherein the projection optical system comprises:
a pair of optical elements that includes a first optical element having a first aspheric surface and a second optical element having a second aspheric surface,
wherein the first aspheric surface and the second aspheric surface have a complementary relationship with each other and are arranged facing each other,
wherein the first aspheric surface and the second aspheric surface are curved in a first direction and a second direction orthogonal to the first direction,
wherein the first direction and the second direction each are orthogonal to an optical axis of the projection optical system,
wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and
wherein the first distortion of the projection optical system is anisotropic between the first direction and the second direction.

15. A device manufacturing method comprising the steps of:
exposing a substrate by using an exposure apparatus, and developing the exposed substrate,
wherein the exposure apparatus comprises:
an illumination optical system configured to illuminate a pattern of a mask by using light from a light source; and
a projection optical system configured to project the pattern of the mask onto a substrate,
wherein the projection optical system comprises:
a pair of optical elements that includes a first optical element having a first aspheric surface and a second optical element having a second aspheric surface,
wherein the first aspheric surface and the second aspheric surface have a complementary relationship with each other and are arranged facing each other,
wherein the first aspheric surface and the second aspheric surface are curved in a first direction and a second direction orthogonal to the first direction,
wherein the first direction and the second direction each are orthogonal to an optical axis of the projection optical system,
wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and
wherein the first distortion of the projection optical system is anisotropic between the first direction and the second direction.

16. A projection optical system for projecting a pattern of a mask onto a substrate, the projection optical system comprising:
a pair of optical elements that includes a first optical element having a first aspheric surface and a second optical element having a second aspheric surface,
wherein the first aspheric surface and the second aspheric surface are curved in a first direction and a second direction orthogonal to the first direction,
wherein the first direction and the second direction each are orthogonal to an optical axis of the projection optical system,
wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and
wherein the first distortion of the projection optical system is anisotropic between the first direction and the second direction.

17. A projection optical system according to claim 16, wherein the first direction is an x-axis direction orthogonal to an optical axis direction of the projection optical system, and the second direction is a y-axis direction orthogonal to the optical axis direction and the x-axis direction.

18. A projection optical system according to claim 16, wherein the first optical element moves only in the first direction and the second optical element moves only in the second direction.

19. A projection optical system according to claim 16, wherein the optical performances include a rotationally asymmetric distortion.

20. A projection optical system according to claim 16, wherein the pair of optical elements are arranged to face the mask.

21. A projection optical system according to claim 16, wherein an order of the first distortion generated by changing the relative position between the first aspheric surface and the second aspheric surface in the first direction is different from an order of the second distortion generated by changing the relative position between the first aspheric surface and the second aspheric surface in the second direction.

22. A projection optical system according to claim 16, wherein:
the first distortion in the first direction is only generated by changing the relative position between the first aspheric surface and the second aspheric surface in the first direction, and
the second distortion in the second direction is only generated by changing the relative position between the first aspheric surface and the second aspheric surface in the second direction.

23. A projection optical system according to claim 16, wherein the first distortion is magnification.

24. A projection optical system according to claim 16, wherein:
the first distortion is a distortion generated in only the first direction, and
the second distortion is a distortion generated in only the second direction.

25. An exposure apparatus comprising:
an illumination optical system configured to illuminate a pattern of a mask; and
a projection optical system configured to project the pattern of the mask onto a substrate,
wherein the projection optical system comprises:
a pair of optical elements that includes a first optical element having a first aspheric surface and a second optical element having a second aspheric surface,
wherein the first aspheric surface and the second aspheric surface are curved in a first direction and a second direction orthogonal to the first direction, wherein the first direction and the second direction each are orthogonal to an optical axis of the projection optical system, wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and wherein the first distortion of the projection optical system is anisotropic between the first direction and the second direction.

26. A device manufacturing method comprising the steps of:

exposing a substrate by using an exposure apparatus, and developing the exposed substrate, wherein the exposure apparatus comprises:

an illumination optical system configured to illuminate a pattern of a mask by using light from a light source; and a projection optical system configured to project the pattern of the mask onto a substrate, wherein the projection optical system comprises:

a pair of optical elements that includes a first optical element having a first aspheric surface and a second optical element having a second aspheric surface, wherein the first aspheric surface and the second aspheric surface are curved in a first direction and a second direction orthogonal to the first direction, wherein the first direction and the second direction each are orthogonal to an optical axis of the projection optical system, wherein a first distortion of the projection optical system generated by changing a relative position between the first aspheric surface and the second aspheric surface in the first direction is a different type from a second distortion of the projection optical system generated by changing a relative position between the first aspheric surface and the second aspheric surface in the second direction, and wherein the first distortion of the projection optical system is anisotropic between the first direction and the second direction.

* * * * *